United States Patent [19]

Yoo

[11] Patent Number: 4,717,871
[45] Date of Patent: Jan. 5, 1988

[54] MEASURING SYMBOL DRIVING CIRCUIT FOR A DIGITAL MULTIMETER

[75] Inventor: Young J. Yoo, Seoul, Rep. of Korea

[73] Assignee: Gukil Digital Ind. Co., Ltd., Seoul, Rep. of Korea

[21] Appl. No.: 826,381

[22] Filed: Feb. 5, 1986

[30] Foreign Application Priority Data

Oct. 30, 1985 [KR] Rep. of Korea ............... 85-14364

[51] Int. Cl.[4] .................... G01R 1/38; G09G 3/18
[52] U.S. Cl. ............................. 324/115; 340/765
[58] Field of Search ............ 324/115, 73 R, 99 D; 340/765, 756

[56] References Cited

U.S. PATENT DOCUMENTS 4,271,410  6/1981  Crawford .................. 340/765 X

OTHER PUBLICATIONS

Norman Strong; "Product Development Profile Rough Life of Digital Multimeter Puts Tough Demands on Design"; Electronics; Jun. 23, 1977; pp. 106-112.
"Digital Hi Tester 3207-3209"; Hoiki E. E. Corp., 1980; pp. 1-4.
"Digital Hi Tester 3203"; Hioki E. E. Corp.; Aug. 1977, pp. 1-2.
"Digital MΩ Hi Tester #3204"; Hioki E. E. Corp.; Aug. 1977, pp. 1-2.

Primary Examiner—Reinhard J. Eisenzopf
Assistant Examiner—Vinh P. Nguyen
Attorney, Agent, or Firm—Birch, Stewart, Kolasch & Birch

[57] ABSTRACT

A measuring symbol driving circuit drives the measurement symbols on a liquid crystal display in a digital multimeter. This measuring symbol driving circuit includes a rotary measuring range changeover switch which selects the respective measuring symbols to be displayed. A control signal generating circuit receives the backplane pulse signal supplied to the common electrode of the liquid crystal display, and phase inverts this signal through the use of an exclusive OR gate in order to develop a control signal supplied to the measuring symbol selected by the measuring range changeover switch. Further, the driving circuit includes a circuit for monitoring the presence of a short circuit between the input jack and common electrode of the digital multimeter to selectively display a short circuit indicator symbol. This input comparing circuit receives the backplane pulse signal at one terminal of an exclusive OR gate and supplies the other terminal of an exclusive OR gate the output of a comparator which is logically high when a short circuit is detected in order to reverse the phase of the backplane signal to produce a control signal for application to the display symbol, and supply the logical low signal to the input of the exclusive OR gate to apply a signal equivalent to the backplane pulse signal to the control terminal of the short circuit symbol to maintain this symbol in a non-displayed state.

9 Claims, 6 Drawing Figures

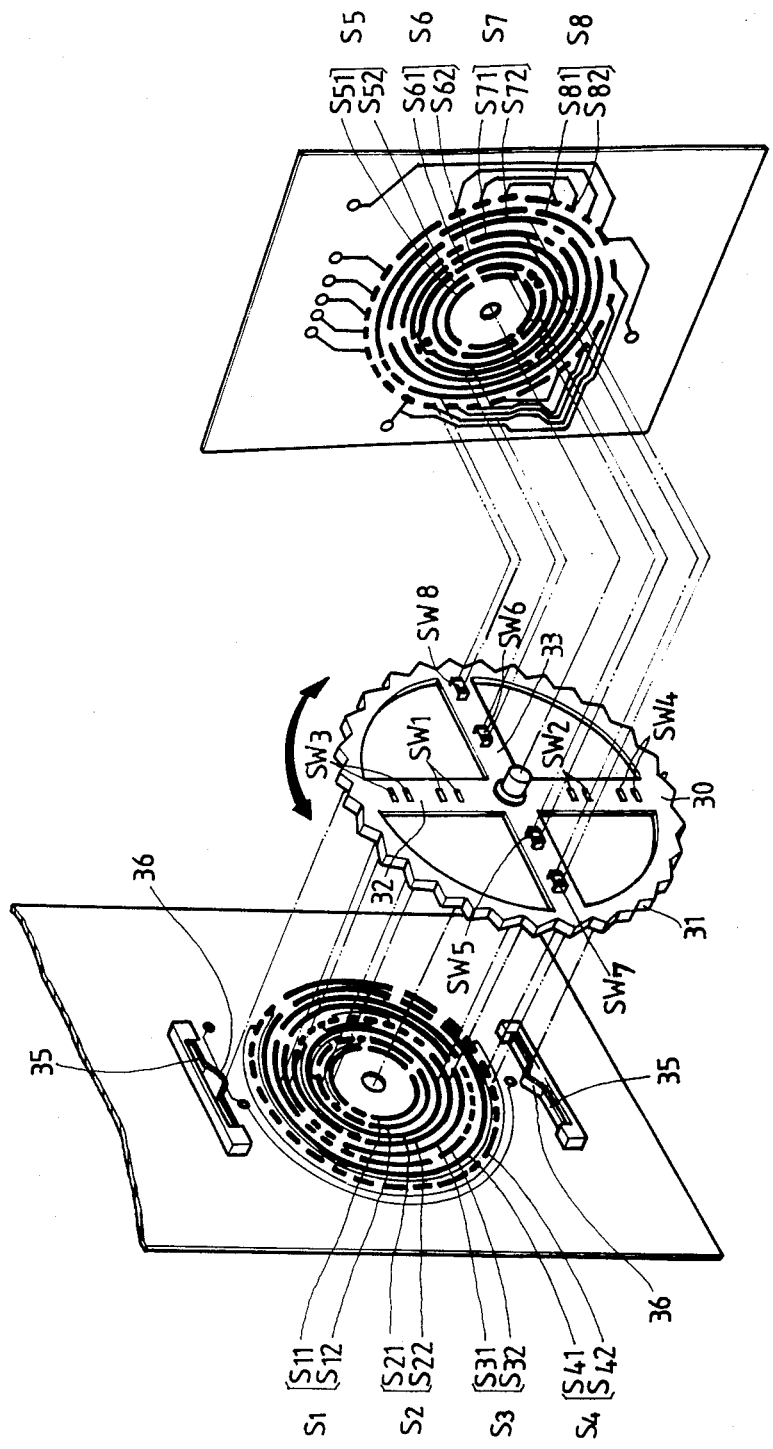

MEASURING SYMBOL DRIVING CIRCUIT FOR A DIGITAL MULTIMETER

FIELD OF THE INVENTION

The present application is directed to a digital multimeter which displays measuring units and functional indicia on a liquid crystal display (LCD) in association with the displayed value of unknown voltages, currents, resistances, and the like. The present application is more particularly directed to a driving circuit for the measuring units and functional indicia displayed on the liquid crystal display to provide an indication of the multimeter's measuring range as well as other information to the user.

BACKGROUND OF THE INVENTION

In general, the liquid crystal display, a device which may be used to display the desired information such as numbers and characters, is formed by disposing a liquid crystal material between control electrodes generally formed on the inner surfaces of insulated substrates. Normally, at least one substrate and its associated electrode are made of a transparent material. When the liquid crystal material between two opposing electrodes is charged with the alternating pulse voltage, a scattering effect occurs so that the liquid crystal material is colored to form a display in the shape of the electrode overlap. This colored area is displayed by the difference in brightness between the scattered portion and the non-scattered portion of the liquid crystal material as illuminated by an external light source. In such a display device, the backplane pulse signal is continuously applied with a regular period to the common electrode of each segment. When a control signal is applied to a control electrode disposed upon the opposite substrate from the common electrode at a phase difference of 180° from the backplane pulse, the liquid crystal material interposed between the control electrode and common electrode is colored. In the case of a measuring instrument such as a digital multimeter or the like, the operation of a measuring range changeover switch is used to control the development of the control signal to a desired numeral or character segment in the liquid crystal display to therefore display the desired number or character.

The measuring symbol driving circuit in a conventional digital multimeter is composed of a circuit having six switches or less. Such a circuit has a small number of control electrodes thereby rendering it difficult to output the proper measuring symbol driving signals in order to display the measuring symbols on the display device. Therefore, it is difficult to develop a measuring circuit which provides the proper number of measuring functions and ranges. Further, the measuring symbol driving circuit in a conventional digital multimeter utilizing a liquid crystal display as the display for measuring symbols, is composed of diodes and logic elements connected to each output terminal of the measuring range changeover switch. As diodes and logic elements must be connected between output terminals of the measuring range changeover switch and a respective control terminal for its associated measuring symbol, the driving circuit must be complex in construction and therefore has a relatively expensive manufacturing cost.

OBJECTS AND SUMMARY OF THE INVENTION

It is therefore an object of the present invention to provide a measuring symbol driving circuit in a digital multimeter which can simply and inexpensively develop and output the control signal to a desired measuring symbol or indicia;

It is another object of the present invention to simply develop and output the control signal to a measuring symbol or the like in a digital multimeter by developing a reverse phase pulse having a phase difference of 180° from the backplane pulse in a simplified manner;

It is another object of the present invention to provide a measuring range changeover switch utilizing an eight contact switch circuit to enable driving of the requisite number of measuring symbol segments in an improved fashion.

To achieve the above specified objects of the present invention, the measuring symbol driving circuit for a digital multimeter according to the teachings of the present invention utilizes an eight contact measuring range changeover switch connected to a measuring signal input jack, the measuring range changeover switch being selectable to desired units to provide the desired sensitivity to the digital multimeter and to develop signals to enable selection of the segments necessary to display the proper measuring range for the digital multimeter. This measuring range changeover switch includes eight switch circuits to enable simplified development of the measuring range symbols. A control signal generator is connected to the measuring range changeover switch and develops a pulse signal having the opposite phase from the backplane pulse to the proper control terminals of the display device through the selected contacts of the measuring range changeover switch. Thus, the control electrodes of the desired measuring symbol are supplied with an energization voltage so as to color the desired control symbols on the liquid crystal display device.

An input comparator is further provided for monitoring the measuring signal input jack to determine the existence of a low impedance across the test leads. The input comparator, in response to such a disconnection, drives a segment to indicate the existence of such a disconnection.

In the display driving circuit of the above mentioned configuration, the measuring range changeover circuit is composed of eight switch circuits bridged by eight separate switch contacts to enable the display of various measuring symbols.

BRIEF DESCRIPTION OF THE DRAWINGS

The detailed advantages of the present invention will become more apparent from the detailed description of Applicants preferred embodiment as described hereinbelow accompanied by the attached drawings, wherein:

FIG. 5 is an exploded perspective view of the interaction of the switch rotor illustrated in FIGS. 3(a), 3(b) with contact sets formed on opposing substrates to construct the measuring range changeover switch according to the teachings of the present invention.

DETAILED DESCRIPTION OF THE PREFERRED EMBODIMENTS

Figure 1:
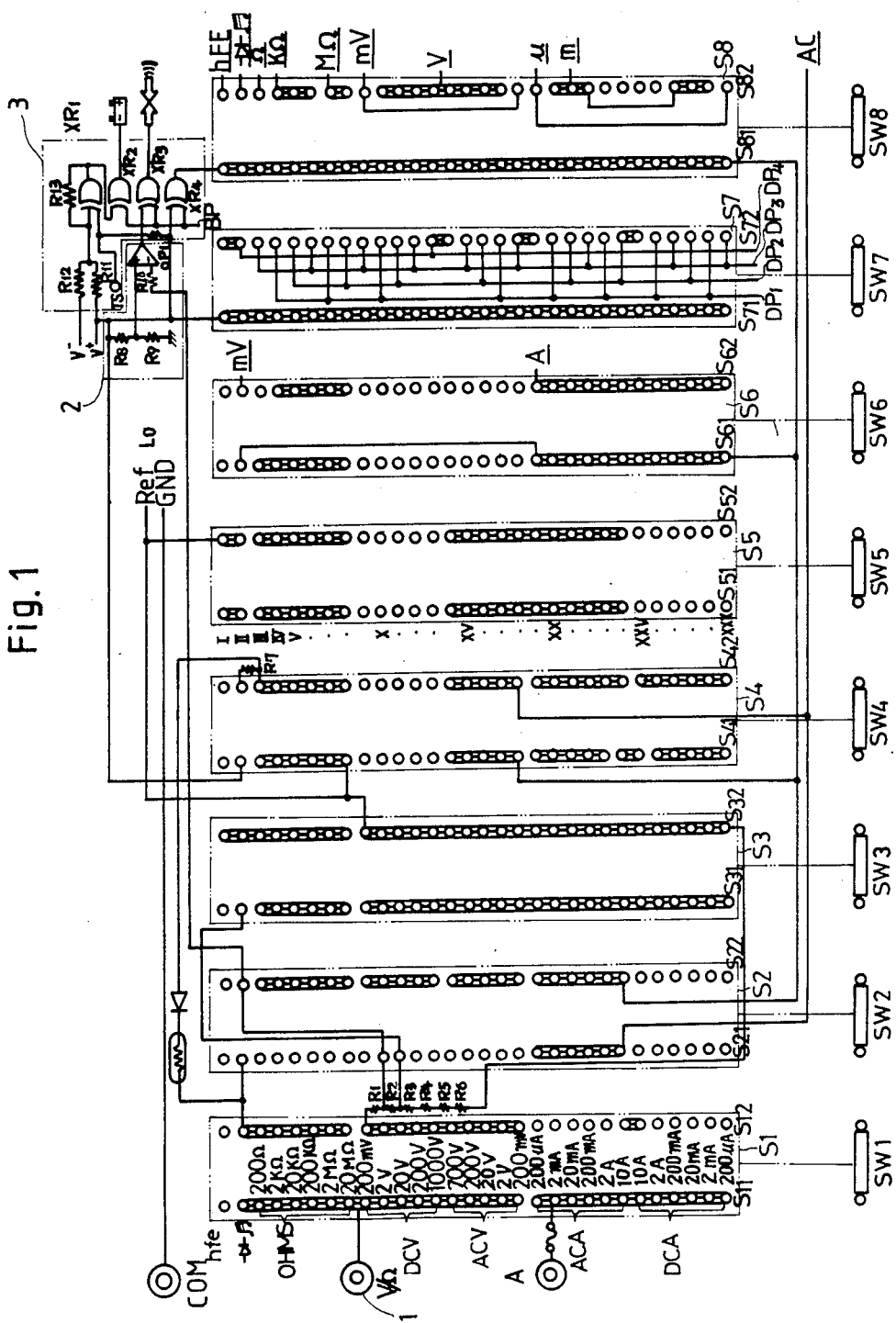
FIG. 1 is a circuit diagram of the switch circuits and associated driving circuitry of one preferred embodiment of the present invention.

Referring now to drawing FIG. 1, a measuring signal input jack 1 is provided for introducing signals to be measured into the digital multimeter circuitry. The digital multimeter circuitry is not described in the present application as such circuitry is, in applicant's preferred embodiment, conventional. The liquid crystal display illustrated in FIG. 2 includes a common electrode formed across the entirety of the backplane of the display, as conventionally known in the art, and a plurality of control electrodes shaped in the form of desired segments and measuring symbols. The common electrode is supplied a backplane pulse signal developed by a backplane pulse generating circuit known in the art. As such a circuit is conventional, it is not described in detail in the present application. However, the backplane pulse signal developed by the circuit is applied to terminal BP of a control signal generating circuit 3 of FIG. 1. Terminal TS of the control signal generating circuit 3 is an input signal which receives a logical "low" signal when the output voltage of a battery included within the digital multimeter formed according to the teachings of the present invention is in normal condition. Input terminal TS is supplied a logical "high" signal when the battery exhibits a low voltage, thereby indicating it is exhausted. Each of the underlined symbols displayed on the right hand side of switch circuits SW6,SW8 schematically illustrate the corresponding display signals associated with the outputs of these respective switch circuits which display the desired measuring ranges of the digital multimeter formed according to the teachings of the present invention.

The measuring range changeover switches SW1–SW8 are switches which are constructed, in the preferred embodiment, to rotate together on a single switch rotor as illustrated in FIGS. 3(a), 3(b) and 5. When a switch SW1 is connected to the junction I of the first switching circuit SW1 (the switch terminals or junctions being numbered from top to bottom in FIG. 1 with the terminal switch SW1 in FIG. 1 being labelled hFE as shown adjacent the contacts of switch SW5), the switches SW2 to SW8 are also connected to their respective junctions I at the top of each of these respective switch circuits. When the changeover switch rotor (30 of FIG. 3(b)) is rotated by a single gear detent 31, each of the switches SW1–SW8 are moved by one junction, for example, from junction I to junction II.

The measuring signals displayed on the display device for each position of the switch rotor 30 of FIGS. 3(a), 3(b) and 5 are illustrated in Table I.

TABLE I

| Connecting junctions of each switches, SW$_1$ to SW$_8$ | Measuring function (limit range for measuring) | Symbol indicated on the display |
|---|---|---|
| Junction I | CE-current amplification factor | hFE |
| Junction II | measurement of diode and short circuit (continuity) test | 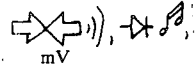 mV |
| Junction III | Resistance (200Ω) | Ω |
| Junction IV | Resistance (2KΩ) | KΩ |
| Junction V | Resistance (20KΩ) | KΩ |
| Junction VI | Resistance (200KΩ) | KΩ |
| Junction VII | Resistance (2 MΩ) | MΩ |
| Junction VIII | Resistance (20 MΩ) | MΩ |
| Junction IX | DC Voltage (200 mV) | mV |
| Junction X | DC Voltage (2 V) | V |
| Junction XI | DC Voltage (20 V) | V |
| Junction XII | DC Voltage (200 V) | V |
| Junction XIII | DC Voltage (1000 V) | V |
| Junction XIV | AC Voltage (700 V) | AC, V |
| Junction XV | AC Voltage (200 V) | AC, V |
| Junction XVI | AC Voltage (20 V) | AC, V |
| Junction XVII | AC Voltage (2 V) | AC, V |
| Junction XVIII | AC Voltage (200 mV) | AC, mV |
| Junction XIX | AC Current (200 μA) | AC, μ, A |
| Junction XX | AC Current (2 mA) | AC, m, A |
| Junction XXI | AC Current (20 mA) | AC, m, A |
| Junction XXII | AC Current (200 mA) | AC, m, A |
| Junction XXIII | AC Current (2 A) | AC, A |
| Junction XXIV | AC Current (10 A) | AC, A |
| Junction XXV | DC Current (10 A) | A |
| Junction XXVI | DC Current (2 A) | A |
| Junction XXVII | DC Current (200 mA) | m, A |
| Junction XXVIII | DC Current (20 mA) | m, A |
| Junction XXIX | DC Current (2 mA) | m, A |
| Junction XXX | DC Current (200 μA) | μ, A |
| | The exhausted condition of the internal battery of the multimeter |  |

Figure 2:
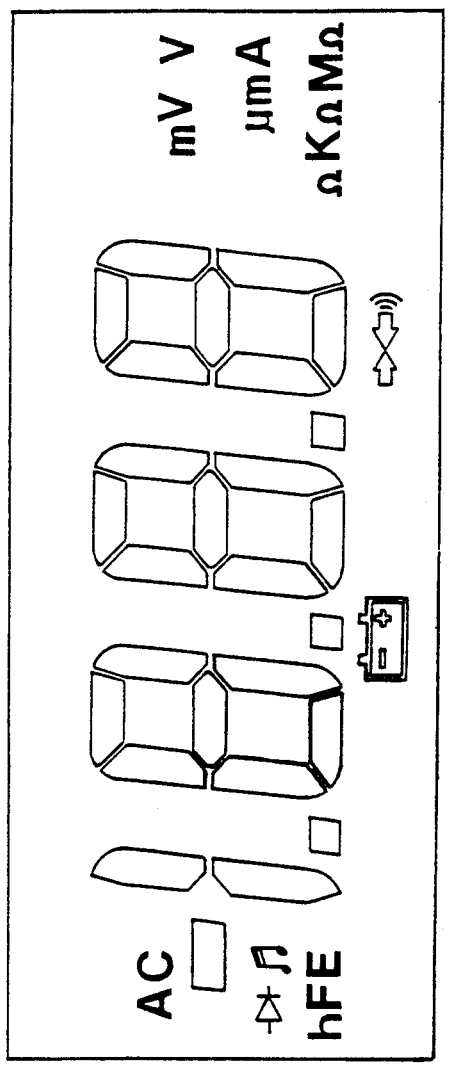
FIG. 2 is an illustration of a typical display including segmental numeric display, and measuring value symbols and indicia.
Figure 3:
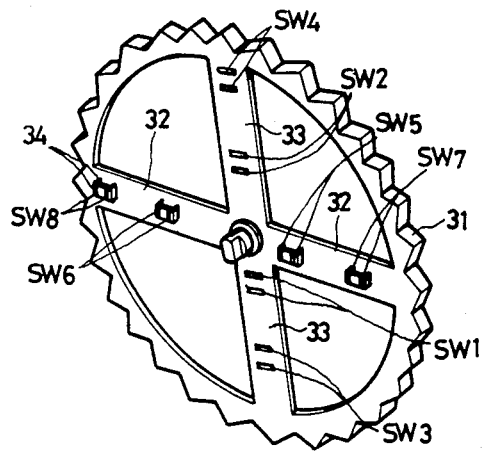
FIG. 3(a) illustrates an upper perspective view of the switch rotor of the measuring range changeover switch constructed according to the teachings of the present invention.
FIG. 3(b) illustrates a lower perspective view of the switch rotor of the measuring range changeover switch formed according to the teachings of the present invention.
Figure 3:
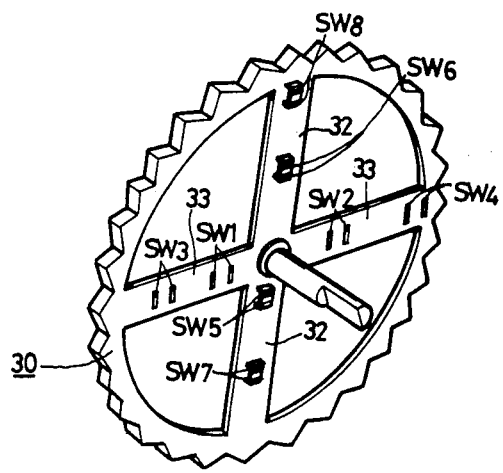

The control signal generating circuit 3 of FIG. 1 develops a control signal to illuminate the battery shaped indicia as shown in FIG. 3, and in the lower central portion of FIG. 2, when the voltage of the battery is insufficient, indicating that the battery is exhausted. The voltage V.— is always applied to an input of the upper exclusive OR gate XR$_1$ through a resistor R$_{12}$. Simultaneously, the positive voltage V+ is also connected to the same input terminal through resistor R$_{11}$. However, the sizing of the resistors effectively supplies the voltage V— to one input of the upper exclusive OR gate XR$_1$, while the other input of the upper exclusive OR gate XR$_1$ has the battery condition signal supplied thereto by its application to input terminal TS. The output of the first exclusive OR gate XR$_1$ is applied to an input of the second exclusive OR gate XR$_2$. The second exclusive OR gate XR$_2$ outputs a signal which has a phase equal to the backplane pulse signal so that the low battery indicator of the display is not displayed when the low voltage signal is supplied at terminal TS indicating that the battery is good. However, when this signal goes logically high, to indicate that the battery voltage is low, the output of the first exclusive OR gate XR$_1$ changes state to a logical one, thus outputting at the output of the second exclusive OR gate XR$_2$, a signal which is 180° out of phase from the backplane pulse signal supplied to the common electrode.

From the above explanation, it should be clear that the backplane pulse signal is applied to the control electrode of the low battery voltage indicator symbol in unaltered form when this symbol is not to be colored, and is applied to the symbol in inverted form when the symbol is to be colored. The exclusive OR gates XR$_3$ and XR₄ control the application of the backplane pulse signal, or an inverted representation of the backplate pulse signal as a control signal to a selected segment in order to color that segment.

The device of the present application also indicates the presence of a short circuit through use of an input comparing circuit 2 connected to the measuring signal input jack 1. When the junction II is selected to select the measurement of diode and short circuit (continuity) test, the resistors R8, R7 and R10 provide a fixed resistance ratio which develops a low output level from the operational amplifier of the input comparing circuit 2 when there is an open circuit between the input jack 1 and the common input terminal of the digital multimeter of the present invention. This low level signal is introduced to one input terminal of a third exclusive OR gate XR₃ which has the other input terminal thereof connected to receive the backplane pulse signal from terminal BP of the rectangular wave generating circuit which produces the backplane pulse signal. Since the output of the operational amplifier of the input comparing circuit 2 is low, the output of the third exclusive OR gate XR₃ is in phase with the backplane pulse signal and thus no display is developed. However, when a short circuit is developed between the input jack 1 and the common jack, the output of the operational amplifier of the input comparing circuit 2 goes logically high and thus the signal applied to the symbol indicating a short circuit is phase inverted from the backplane signal to color this symbol indicating a short circuit as displayed below the right-most display digit of FIG. 2, and as shown as the left-most symbol in Table I associated with junction II.

When the measurement of diode and short circuit (continuity) test is selected by the selection of junction II by rotation of the switch rotor 30, the fourth exclusive OR gate XR₄ is connected to the junction II of the sixth switch circuit S6 by way of the eighth switch circuit S8 to display the symbol "mV" to indicate that the measurement of the forward voltage of a diode is displayed in millivolts. Simultaneously, the symbol shown in the center of the indicated symbols associated with junction II in Table I is displayed by application of the output of the fourth exclusive OR gate XR₄ to the output of switch SW8. Since one input of the exclusive OR gate XR₄ is connected to the terminal supplying the backplane pulse signal, and the other terminal is permanently biased to a logical high by connection to the voltage V+, the symbol associated with each of the junctions I-XXX of switch SW will display the particular signal associated therewith. In a measurement signal indicating that a short circuit is present, the two arrows indicate the short circuit condition while the three curved lines indicate that a buzzer rings to audibly indicate the short circuit condition.

When any of the junctions I-XXX is selected to place the multimeter in a mode to measure a particular range of volts, amps, or ohms, the required measurement units are automatically displayed. The measuring range changeover switch connects the control electrode of each symbol desired to be displayed through the selection of the control terminals of switches SW2, SW4, SW6 and SW8. FIG. 2 shows the physical arrangement of each of these measuring symbols on a representative display arrangement of the preferred embodiment. FIG. 2 demonstrates how the measuring symbols may be arranged in relation to the measuring range. Each of these symbols is displayed by developing a control pulse having a phase opposite to the backplane pulse signal supplied to the backplane or common electrode. The output from the exclusive OR gate XR₄ which develops this signal opposite in phase to the backplane pulse signal, is supplied to respective measuring symbols through the operation of the changeover switches SW1-SW8.

For example, reference will be made to the operation of the circuit of the present invention to measure and display AC current expressed in terms of milliamperes. Each of the switches SW1-SW8 are connected to one of junction XX-XXII in accordance with the measuring range selected. When junction XX is selected, the signal outputted from the exclusive OR gate XR₄ of the control generating circuit 3 is applied to the common electrode $S_{81}$ of the eighth switch circuit S8. Both the junction XX of the common electrode $S_{81}$ and the junction XX of the control electrode $S_{82}$ of the eighth switch circuit S8 are connected by the switch SW8 so that the signal outputted from the fourth exclusive OR gate XR₄ is applied to the control terminal for displaying a symbol "m" on the display device by way of the junction XX of the control electrode $S_{82}$. Accordingly, the symbol "m" is displayed on the display device. At the same time, because both the junction XX of the electrode $S_{61}$ and the junction XX of the electrode $S_{62}$ are connected by the switch SW6, the signal outputted from the fourth exclusive OR gate XR₄ and applied to the electrode $S_{61}$ in the sixth switch circuit S6 from a common electrode $S_{81}$ of the eighth switch circuit is therefore applied to the control terminal for displaying the symbol "A" on the display device. The symbol "A" is therefore displayed. At the same time, because the junction XX of the electrode $S_{21}$ and the junction XX of the electrode $S_{22}$ are interconnected by the switch SW2, the signal outputted from the fourth exclusive OR gate XR₄ and applied from the common electrode $S_{81}$ in the eighth switch circuit S8 to the electrode $S_{22}$ in the second switch circuit S2 is applied to the junction XX of the electrode $S_{21}$ in the second switch circuit S2. This signal is therefore applied to the control terminal for displaying the symbol "AC" on the display device so that the symbol "AC" is displayed. It can therefore be seen that when the switches SW1-SW8 are connected to the junction XX of the switch circuits S1-S8, the symbols "AC, mA" are displayed on the display device so that the operator of the multimeter of the present invention is advised that AC current in terms of milliamperes is measured. Similarly, when one of the other junction is selected, the appropriate measuring units are also displayed in a similar fashion.

Now referring to the measuring symbols shown in FIG. 1 and FIG. 2, hFE represents the emitter commoned amplification factor; ⇥ ⌐ , the measuring of Diode; Ω, KΩ, MΩ the measurement of resistance; mV, V the measurement of voltage; AC, the measurement of alternating current and/or voltage; μ, m,A is to show the measurement of current combined to display μA, mA, or A according to the operation of the changeover switch.

The ends of the lines connected to the junction of the electrode $S_{72}$ of the seventh switch circuit S7 are connected to the control terminals of first, second, and third decimal points of the display. Vertical lines $DP_1$, $DP_2$ and $DP_3$ are connected to these decimal points while line $DP_4$ is left open circuited. Line $DP_1$ is connected to the left-most decimal point illustrated in the display of FIG. 3; Line $DP_2$ to the center decimal point of the display of FIG. 2; and Line $DP_3$ to the right-most decimal point on the display of FIG. 2.

The changeover switch rotor 30 is illustrated in FIGS. 3(a), 3(b) and 5. In FIGS. 3(a) and 3(b), the changeover switch rotor is shown in detail including its support of a plurality of changeover switch contacts SW1-SW8. These switches SW1-SW8 are operated together by rotation of switch rotor 30 about its shaft. A plurality of gear detents 31 of FIG. 3(a) are arranged about the periphery of the switch rotor 30. Each gear detent is associated with an individual switch range. When the switch rotor 30 is rotated, it is rotated one gear detent 31 at a time as limited by the upper and lower springs 35 including their associated resilient detent bends 36 which are engaged with the gear detents 31 of the switch rotor 30. Thus, each of the switch junctions I-XXX is positively located through interaction of the spring 35 and the gear detent positions 31. While FIG. 1 illustrates the switch movement in terms of linear vertical motion, this motion, in a preferred embodiment, is actually a rotary motion as illustrated in FIG. 5 with the individual switch contacts being disposed upon surfaces juxtaposed with the switch rotor 30 as shown in FIG. 5. The switch rotor 30 is provided with eight switches SW1-SW8 mounted on the cross-shaped switch mounting parts 32,33 of the switch rotor 30 in order to form an eight switch circuit.

Figure 4:
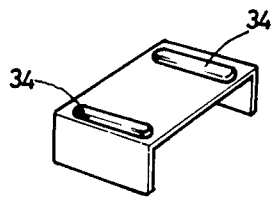
FIG. 4 is a perspective view of a single switch contact SW1–SW8 mounted to the switch rotor of FIGS. 3(a)–3(b) of the measuring range changeover switch formed according to the teachings of the present invention.

FIG. 4 illustrates a detail of each of the switch contacts S1-S8 mounted on the switch rotor 30. Each switch contact contains a pair of projecting portions 34 which respectfully contact both electrodes of its respective switch S1-S8, for example, S11, S12. Each of the switch contacts as illustrated in FIG. 4 is formed of a material which exhibits good conduction properties in order to ensure proper interconnection of the respective contacts S11-S12 to S81-S82.

While the foregoing description has explained the operation of a preferred embodiment of applicant;s invention, it should be understood that various changes and modifications in the device disclosed in the preferred embodiment may be readily made without departing from the spirit and scope of the present invention. For example, the present invention could be constructed with a 9 switch circuit or 10 switch circuit. It should therefore be evident that the present invention should be limited only be the scope of the appended claims and may be modified as would occur to one of ordinary skill in the art without departing from the spirit and scope of this claimed invention.

I claim:

1. A circuit for driving the measuring range symbols of a display in a digital multimeter using a measuring range selection switch, said circuit comprising:
   a display for displaying said measuring symbols, said display including a plurality of symbol control electrodes, each associated with a measuring symbol to be displayed;
   control signal generating means, receiving a backplane pulse signal for developing a control signal opposite in phase to said backplane pulse signal; and
   measuring range display selection switch means, formed as part of said measuring range selection switch and operatively connected for movement therewith; for selectively directing said control signal developed by said control signal generating means to one or more of said symbol control electrodes to thereby drive one or more selected measuring range symbols associated with a selected measuring range.

2. The circuit of claim 1 wherein said measuring range selection switch comprises an 8 switch circuit.

3. The circuit of claim 1 wherein said display is a liquid crystal display panel.

4. The circuit of claim 1 further comprising:
   an input jack to which a point having a value to be measured is connected;
   input comparator means, operatively connected to said input jack and selectively disabled by said measuring range selection switch, for monitoring an impedance between said input jack and a circuit ground and for developing a first logical signal when a low impedance is detected;
   said control signal generating means, in response to said first logical signal, developing a control signal opposite in phase to said backplane pulse signal and applying said signal to a short indicating indicia to display an indication of a short.

5. The circuit of claim 1 wherein said measuring range selection switch comprises:
   a rotatable switch rotor having a plurality of switch contacts mounted thereon, said switch rotor including a plurality of gear detents formed about the periphery thereof for engagement with at least one detent spring to positively locate said measuring range selection switch in a plurality of switch positions.

6. The circuit of claim 5 wherein said switch contacts are mounted along cross shaped support portions of said switch rotor.

7. The circuit of claim 1 wherein said control signal generating means comprises a first exclusive OR gate receiving said backplane pulse signal at one input thereof and having the other input thereof biased logically high, said exclusive OR gate developing said control signal at its output which is connected to said measuring range display selection switch means.

8. The circuit of claim 4 wherein said control signal generating means comprises a first exclusive OR gate receiving said backplane pulse signal at one input thereof and having the other input thereof biased logically high, said exclusive OR gate developing said control signal at its output which is connected to said measuring range display selection switch means.

9. The circuit of claim 8 wherein said control signal generating means comprises second exclusive OR gate having a first input connected to said input comparator means and having a second input connected to receive said backplane pulse signal, said second exclusive OR gate having an output developing said control signal and connected to said short indicating indicia of said display.

* * * * *